United States Patent [19]

Mizutani

[11] 4,437,225

[45] Mar. 20, 1984

[54] METHOD OF FORMING SOS DEVICES BY SELECTIVE LASER TREATMENT AND REACTIVE FORMATION OF ISOLATION REGIONS

[75] Inventor: Yoshihisa Mizutani, Tokyo, Japan

[73] Assignee: Tokyo Shibaura Denki Kabushiki Kaisha, Japan

[21] Appl. No.: 341,583

[22] Filed: Jan. 21, 1982

[30] Foreign Application Priority Data

Jan. 28, 1981 [JP] Japan .................. 56-11086

[51] Int. Cl.³ ............... H01L 21/263; H01L 21/26
[52] U.S. Cl. ....................... 29/576 B; 29/576 W; 29/571; 148/187; 357/91
[58] Field of Search ............ 29/576 B, 576 W, 571; 148/1.5, 187; 357/91

[56] References Cited

U.S. PATENT DOCUMENTS

| | | | |
|---|---|---|---|
| 4,292,091 | 9/1981 | Togei | 148/1.5 |
| 4,319,954 | 3/1982 | White et al. | 156/628 |
| 4,323,417 | 4/1982 | Lam | 156/613 |
| 4,338,139 | 7/1982 | Shinada | 148/1.5 |
| 4,339,285 | 7/1982 | Pankove | 148/1.5 |

FOREIGN PATENT DOCUMENTS 56-21320 2/1981 Japan .

OTHER PUBLICATIONS

Chang, C-A, IBM-TDB, 20, (1977), 2459.
Fang et al., IBM-TDB, 23, (1980), 362.
Kamins et al., IEEE-Electron Device Letts., EDL-1, (1980), 214.
Tasch et al., Electronics Letts., 15, (14), 1979, 435.

*Primary Examiner*—Upendra Roy
*Attorney, Agent, or Firm*—Finnegan, Henderson, Farabow, Garrett & Dunner

[57] ABSTRACT

Disclosed is a method of fabricating semi-conductor devices comprising the steps of: forming non-single-crystalline semiconductor layer on a singlecrystalline insulation substrate, ion-implanting selectively material, which reacts with the semi-conductor layer to form insulating material, into the semiconductor layer; and applying an energy radiation or a heat treatment to the semiconductor layer, whereby the non-singlecrystalline semiconductor layer portion not implanted with said material is singlecrystallized with a seed of the single-crystalline insulation substrate and at the same time the non-singlecrystalline semiconductor layer portion implanted with the material is rendered insulated.

8 Claims, 20 Drawing Figures

F I G. 2A 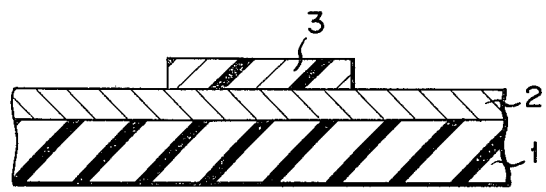
F I G. 2B 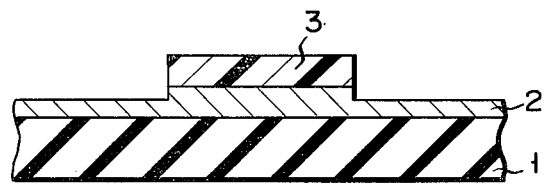
F I G. 2C 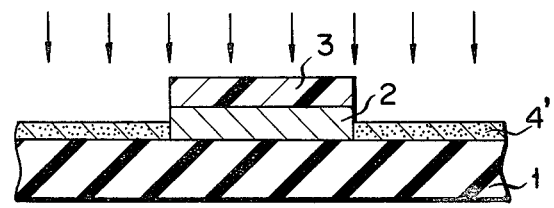
F I G. 2D 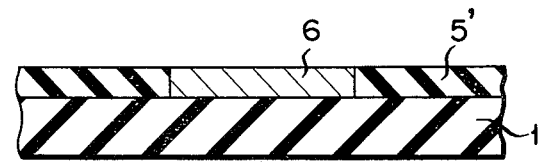
F I G. 2E 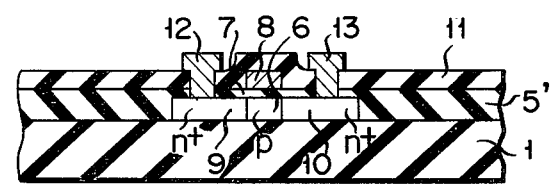

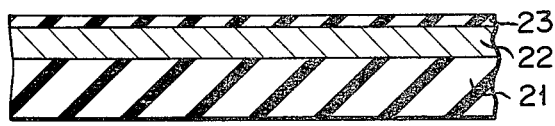
F I G. 3A
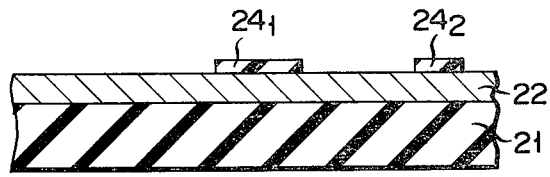
F I G. 3B
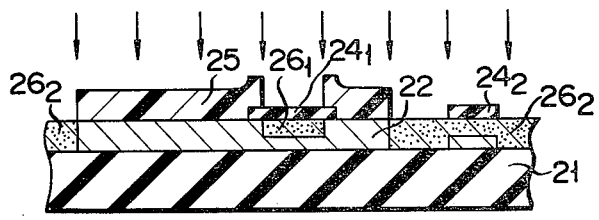
F I G. 3C
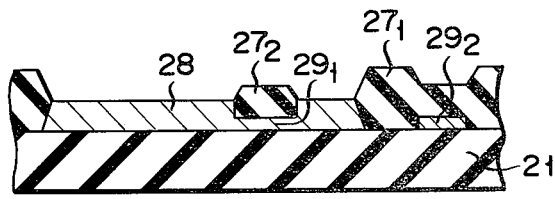
F I G. 3D
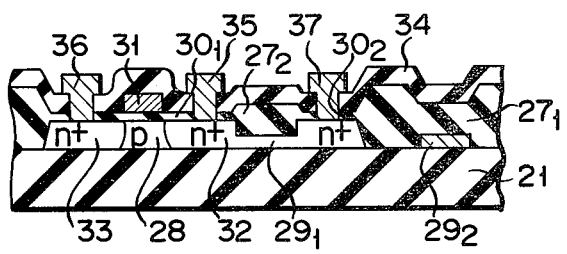
F I G. 3E

METHOD OF FORMING SOS DEVICES BY SELECTIVE LASER TREATMENT AND REACTIVE FORMATION OF ISOLATION REGIONS

BACKGROUND OF THE INVENTION

The present invention relates to a method of fabricating semiconductor devices in which elements are formed in a semiconductor layer formed on a single crystalline insulation substrate.

The semiconductor device of this type, known as an SOS (silicon on sapphire), for example, has generally been fabricated using a silicon layer epitaxially grown on a single crystal sapphire substrate. Since this method employs the epitaxial growing process for forming the silicon layer, however, it takes a long time for the silicon layer formation and is a low productivity process. The epitaxial growing process is continued at high temperature of about 1,000° C. for a long time. In the course of this process, the auto-doping of the aluminum from the sapphire substrate takes place, resulting in remarkable deterioration of the element characteristics.

In this type semiconductor device, there is known a method for insulating an element in which the silicon thin layer portion (i.e. called the field region) except for the element region is etched away thereby isolating the elements individually. In order to avoid the adverse effect of the end face of the isolated silicon region, it is desirable to employ an element insulating method in which the field region is selectively oxidized to form an oxide film. Also in this selective insulating method, the auto-doping takes place like the previous case. The result is that the oxidizing temperature is limited and much time is required for the oxidizing process.

SUMMARY OF THE INVENTION

Accordingly, the present invention has an object to provide a method of fabricating semiconductor devices which can simultaneously form a single crystal semiconductor layer and an insulation film for insulating the single crystal semiconductor layer on a single crystal insulation substrate using a short-time heat treatment and not the epitaxial process.

According to the present invention, there is provided a method of fabricating semiconductor devices comprising the steps of: forming non-single crystal semiconductor layer on a single crystal insulation substrate; ion-implanting selectivity material, which reacts with the semiconductor layer to form insulating material, into the semiconductor layer; and applying an energy radiation or a heat treatment to the semiconductor layer, whereby the non-single crystal semiconductor layer portion not implanted with said material is single crystallized with a seed of the single crystal insulation substrate and at the same time the non-single crystal semiconductor layer portion implanted with the material is rendered insulative.

The single crystal insulation substrate used in the present invention may be a single crystal sapphire substrate, a single crystal spinel substrate, or the like.

The non-single crystal semiconductor layer used in the present invention may be a polycrystal silicon layer, an amorphous silicon layer and the like. The semiconductor layer may be formed on a single crystal insulation substrate by the chemical vapor deposition (CVD) process or the PVD process such as a sputtering deposition.

Materials which react with the non-single crystal semiconductor layer used in the present invention to form an insulating material are oxygen, nitrogen, and the like. The selective ion-implantation of the material into the non-single crystal semiconductor layer may be executed using, for example, a resist pattern or an insulation pattern as a mask. In this case, a film (e.g. CVD-SiO$_2$ film) is formed on the surface of the non-single crystal semiconductor region into which the material is to be ion-implanted for controlling the ion-implantation depth. The film mentioned permits distributing the implanted ions in the surface region only of the semiconductor region. In addition, the surface region mentioned can be converted into an insulating layer in the subsequent step of, for example, irradiation with an energy beam. Alternatively, the thickness of the non-single crystal semiconductor layer region into which the ion-implantation is made is selectively thinned by etching certain regions before or after the etching process so that they are thinner than the other regions. According to this approach, an insulation layer to be formed by the succeeding energy beam radiation may be flush with the single crystal semiconductor layer, flattening the resultant structure of the semiconductor. In a further modification, after the thickness of the non-single crystal semiconductor layer into which the ions are to be implanted is partially thinned, the material is ion-implanted, thereby to distribute the material in the surface region only of the thick semiconductor layer region. According to this approach, an insulation layer present in only the surface region of the non-single crystal semiconductor layer and another insulation layer reaching the single crystal insulation substrate may be formed by the ensuing energy beam radiation.

The energy beam in the present invention may be a laser beam, an electron beam, or the like. In a further modification of the present invention, prior to the energy beam radiation, material for disturbing the crystallizability to improve energy absorption efficiency, for example, silicon, germanium or an inert substance such as argon, may be ion-implanted into at least the region to be single crystallized. The ion-implantation method mentioned is also effective in the case where heat treatment is employed for the conversion into single crystal based on the solid-phase epitaxy phenomenon.

BRIEF DESCRIPTION OF THE DRAWINGS

FIGS. 2A to 2E show in cross sectional form a sequence of steps for fabricating a MOS semiconductor device as a second embodiment of the present invention;

FIGS. 3A to 3E show in cross sectional form a sequence of steps of fabricating an E-R type inverter as a third embodiment of the present invention.

DETAILED DESCRIPTION OF THE PREFERRED EMBODIMENTS

The examples of a method of fabricating semi-conductor devices according to the present invention will be described referring to the accompanying drawings.

EXAMPLE 1

Figure 1A:
FIGS. 1A to 1D show in cross sectional form a sequence of steps for fabricating a MOS semiconductor device as an embodiment of the present invention.
Figure 1B:
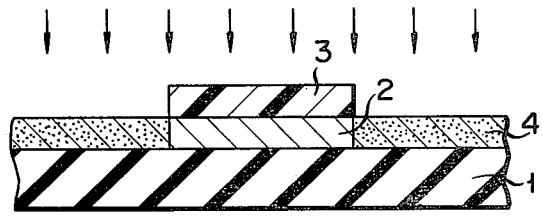

(i) To start, a polycrystal silicon layer 2 of 5,000 Å in thickness is deposited on a single crystal sapphire substrate 1 by the CVD process, as shown in FIG. 1A. Succeedingly, a resist pattern 3 is formed on a portion of the polycrystal silicon layer 2 where an element is to be formed. Oxygen is ion-implanted into the resultant structure with a mask of the resist pattern 3, under a condition that the output power is 80 KeV and the dosage is $1 \times 10^{18}/cm^2$ and the oxygen is again ion-implanted under a condition that the radiation output power is 170 KeV and the dosage is $1 \times 10^{18}/cm^2$. Through the ion-implantation process, an oxygen ion-implanted layer 4 reaching the interface of the single crystal sapphire substrate 1 is formed in the polycrystal silicon layer 2 (FIG. 1B). Since the polycrystal silicon layer 2 is thick, e.g. 5,000 Å, the oxygen ion-implantation is conducted two times. When the polycrystal silicon layer is thin, however, one time of the ion-implantation is satisfactory for forming the oxygen ion-implanted layer 4.

Figure 1C:
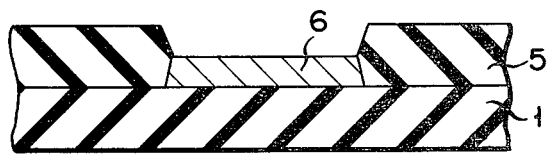

(ii) After removal of the resist pattern 3 and to improve the absorption efficiency of the energy beam, silicon is ion-implanted into the entire surface of the resultant structure under a condition that the output power is 200 KeV and the dosage is $3 \times 10^{16}/cm^2$. A lattice defect is caused in the polycrystal silicon layer 2, and further the entire surface of the resultant structure is irradiated with Nd-YAG laser rays. As the result of the process, the polycrystal silicon layer 2 is expitaxially regrown as a seed of the crystal lattice of the sapphire substrate 1. At the same time, in the oxygen ion-implanted layer 4, oxygen reacts with its surrounding silicon atoms to be transformed into silicon oxide. As a result, an insular single crystal silicon layer 6 peripherally separated by the silicon oxide film 5 is formed, as shown in FIG. 1C. In this step, the laser radiation may be substituted by a high temperature treatment in a furnace or by the radiation heat radiated from a carbon heater, for example. The high temperature treatment may be used as an ensuing heat treatment step, for example, a gate oxidation step. It is suggested, however, that these heat treatments are conducted separately, from a viewpoint of film quality.

Figure 1D:
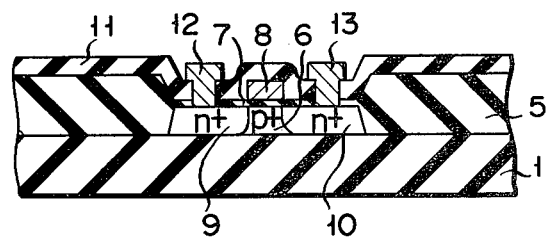

(iii) Then, boron is doped into the insular single crystal silicon layer 6 for controlling a threshold value, thereby to render the layer p-type. And the resultant structure is subjected to a heat treatment in a dry oxygen atmosphere to form a 500 Å gate oxide film 7 on the single crystal silicon layer 6. Subsequently, an arsenic doped polycrystal silicon film of 3,000 Å thickness is deposited by the CVD process and then patterned by the photoetching process, thereby to form a gate electrode 8. In the next step, arsenic is ion-implanted into the p-type single crystal silicon layer 6 through the gate oxide film 7, with the gate electrode 8 acting as a mask, thereby to form $n^+$-type source and drain regions 9 and 10. Following the step, a CVD-SiO$_2$ film of 1 μm thickness is deposited to form a contact hole. Then, an Al film is deposited thereover and is patterned to form Al electrodes 12 and 13 leading to a source and a drain. In this way, a MOS semiconductor device is fabricated (FIG. 1D).

As described above, in the first example, after oxygen is selectively ion-implanted in a polycrystal silicon layer 2 on the sapphire substrate 1, the entire surface of the resultant structure is irradiated with the laser rays. Through this process, the single crystal silicon layer 6 in which the MOS transistor is formed and the silicon oxide film 5 for separating the single crystal silicon layer 6 can be formed simultaneously. Accordingly, the present embodiment can remarkably reduce the fabricating time, when compared with the conventional method in which the single crystal silicon layer is formed by the epitaxial growing process and the silicon layer is insulated by selectively oxidizing it. Further, in the present example, there is no need for the high temperature and long time which are required for the epitaxial growing and the selective oxidation processes. It is possible to limit the auto-doping of Al from the sapphire substrate 1. A mass-production of high performance MOS semiconductor devices is realized.

EXAMPLE 2

(i) A 5,000 Å polycrystal silicon layer 2 is first formed on a single crystal silicon sapphire substrate 1 by the CVD method, as shown in FIG. 2A. In the next step, a photoresist pattern 3 is formed in a portion of the polycrystalline silicon layer 2 where an element is to be formed, by the photoetching process. Making the resultant semiconductor structure with the resist pattern 3, the polycrystal silicon layer 2 is subjected to a reactive ion etching process to reduce the thickness of its exposed portion by 2,500 Å (FIG. 2B). In this case, the reactive ion etching process may be substituted by the process using the etching solution of hydrofluoric acid or the CF$_4$ plasma. Subsequently, with the same mask of the resist pattern 3, oxygen is ion-planted into the structure under a condition that the output is 60 KeV and the dosage is $1 \times 10^{18}/cm^2$, thereby to forming in the etched portion of the polycrystal silicon layer an oxygen non-implanted layer 4' reaching the boundary between the polycrystal silicon layer and the single crystal sapphire substrate 1 (FIG. 2C).

(ii) Then, the resist pattern 3 is removed and the entire surface of the resultant structure is irradiated with Nd-YAG laser. At this time, the polycrystal silicon layer 2 is single crystallized with a seed of the crystal lattice of the sapphite substrate 1. At the same time, in the oxygen ion-implanted layer 4', oxygen reacts with its surrounding silicon atoms to form silicon oxide with an increased volume. In this way, an insular single crystal silicon layer 6 is formed which is surrounded by a silicon oxide film 5' with a uniform thickness, as shown in FIG. 2D.

(iii) For forming a MOS semiconductor device, according to the steps of the above (iii) in the Example 1, the single crystal silicon layer 6 is rendered p-type; a gate oxide film 7 is grown; a gate electrode 8 is formed; $n^+$-type source and drain regions 9 and 10 are formed; a CVD-SiO$_2$ film 11 is deposited; contact holes are opened; Al electrodes 12 and 13 are formed (FIG. 2E). In FIG. 2, like symbols are used for designating like portions in FIG. 1.

As described, according to the fabricating method of the second example, a silicon oxide film 5' for insulating the single crystal silicon layer 6 where elements are to be formed may be formed flush with the silicon layer 6. The flattened surface of the resultant structure prevents the Al wires 12 and 13 from being disconnected.

EXAMPLE 3

(i) A 5,000 Å polycrystal silicon layer 22 and a 2,000 Å SiO$_2$ film 23 are successively deposited on the single crystal sapphire substrate 21, by the CVD process, as shown in FIG. 3A. Then the SiO$_2$ film 23 is selectively etched by the photoetching process to form SiO$_2$ film patterns 24$_1$ and 24$_2$ (FIG. 3B).

(ii) A resist pattern 25 having an opening located corresponding to the SiO$_2$ film pattern 24$_1$ is formed, by the photoetching process, on a portion of the polycrystal silicon layer 22 where elements are to be formed. Then, oxygen is ion-implanted doubly using a mask of the resist pattern 25, as in the Example 1. As the result of the double ion-implantation, an oxygen ion-implanted layer 26$_1$ is formed in the polycrystal silicon layer 22 under the SiO$_2$ film pattern 24$_1$ which is exposed through an opening of the resist pattern 25. The layer 26$_1$ does not reach the interface between the sapphire substrate 21 and the polycrystal silicon layer 22 because of the presence of the SiO$_2$ film pattern 24$_1$. Additionally, formed in the polycrystal silicon layer 22 exposed around the resist pattern 25 is an oxygen ion-implanted layer 26$_2$ reaching the sapphire substrate 21 except the region under an SiO$_2$ film pattern 24$_2$ (FIG. 3C).

(iii) Then, after the resist pattern 25 and the SiO$_2$ film patterns 24$_1$ and 24$_2$ are removed, the entire surface of the semiconductor structure is irradiated with Nd-YAG laser. At this time, no oxygen ion-implanted region of the polycrystal silicon layer is single crystallized, but rather the oxygen ion-implanted region 26$_1$ and 26$_2$ are transformed into silicon oxide layers, respectively. In this way, an insular single crystal silicon layer 28 peripherally insulated by a silicon oxide film 27$_1$ is formed, as shown in FIG. 3D. A silicon oxide film 27$_2$, originating from the oxygen ion-implanted layer 26$_1$ and not reaching the interface of the sapphire substrate 21, is formed in a part of the surface layer of the single crystal silicon layer 28. At the same time, a single crystal silicon region 29$_1$ is formed under the same oxide film 27$_2$ and a single crystal silicon region 29$_2$ with the same configuration as that of the SiO$_2$ film pattern 24$_2$ is formed in the vicinity of the interface between a part of the silicon oxide film 27$_1$ and the sapphire substrate 21.

(iv) For the threshold control, boron is doped into an insular single crystal silicon layer 28 thereby rendering the layer 28 p-type. Then, the resultant structure is subjected to a heat treatment in a dry oxygen atmosphere. Through the heat treatment, gate oxide film 30$_1$ and 30$_2$ of 500 Å are grown on the single crystal silicon layer 28. Following this process, an arsenic doped polycrystal silicon film of 3,000 Å in thickness is formed through deposition by the CVD process. Then, it is patterned by the photoetching process to form the gate electrode 31 on the gate oxide film 30$_1$. Further, arsenic is ion-implanted for activation into the p-type single crystal silicon layer 28 through the gate oxide films 30$_1$ and 30$_2$, with a mask of the gate electrode 31, thereby to form n$^+$-type source and drain regions 32 and 33 Subsequently, the CVD-SiO$_2$ film 34 of 1 $\mu$m in thickness is formed through deposition; necessary contact holes are formed; an Al film is vapor-deposited and patterned; Al lead wires 35 to 37 connected to the source, drain and resistor are formed. Through a sequence of these process steps, an E-R type inverter is formed (FIG. 3E).

As described above, according to the third example, the single crystal silicon region 29$_1$ under the silicon oxide film 27$_2$ can be used as a resistive element. This fact allows an easy fabrication of the E-R type inverter. Further, the single crystal silicon region 29$_2$ buried under the silicon oxide film 27$_1$ (field region) can be used as the lead wire. Therefore, it is possible to obtain the E-R type inverter with a high reliable multilayered wiring structure. In the present example, the single crystal silicon region 29$_1$ is used as the resistive element connected to the source region 32. Alternatively, this region may be used as a potential control terminal of the channel region by connecting it to the channel region as the p-type single crystal silicon layer 28 shown in FIG. 3E.

EXAMPLE 4

Figure 4A:
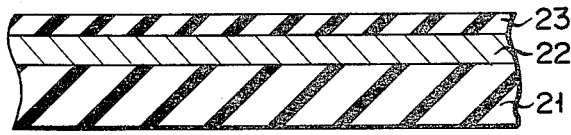
FIGS. 4A to 4F are cross sectional views illustrating a sequence of steps for fabricating an E-R type inverter as a fourth embodiment of the present invention.
Figure 4B:
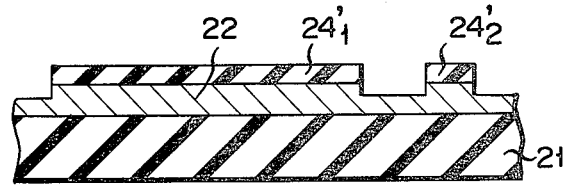

(i) As shown in FIG 4A, a 5,000 Å polycrystal silicon layer 22 and a 2,000 Å SiO$_2$ film 23 are successively deposited on the single crystal sapphire substrate 21 by the CVD process. Following this, the SiO$_2$ film 23 is selectively etched by the photoetching process to form SiO$_2$ film patterns 24'$_1$ and 24'$_2$. With a mask of the SiO$_2$ film patterns 24'$_1$ and 24'$_2$ the exposed portions of the polycrystal silicon layer 22 are reduced in thickness by about 2,500 Å by the reactive ion etching process, thereby to form a thin polycrystal silicon region (FIG. 4B).

Figure 4C:
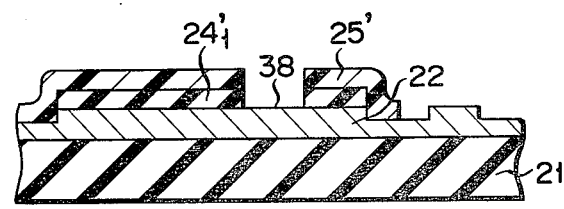
Figure 4D:
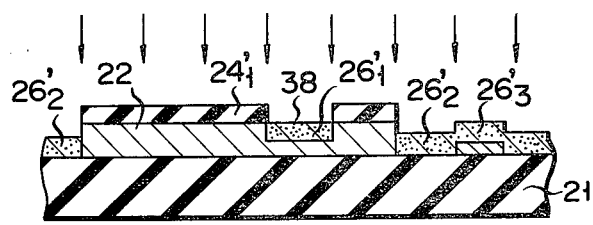
Figure 4E:
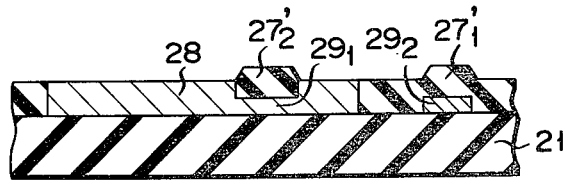

(ii) After forming a resist pattern 25' having a window and covering the SiO$_2$ film pattern 24'$_1$ is formed, the SiO$_2$ film pattern 24'$_1$ masked with the resist pattern 25', is selectively etched away to form an opening 38, while at the same time the remaining SiO$_2$ film pattern 24'$_2$ is removed (FIG. 4C). Then, after the resist pattern 25' is removed, oxygen is ion-implanted into the resultant structure, with a mask of the SiO$_2$ film pattern 24'$_1$ under a condition that the output is 60 KeV and the dosage is $1 \times 10^{18}$/cm$^2$. As the result of the ion-implantation, an oxygen ion-implanted layer 26'$_1$ not reaching the interface between the sapphire substrate 21 and the polycrystal silicon layer 22 is formed in a portion of the polycrystal silicon layer 22 where it is exposed through the opening 38 of the SiO$_2$ film pattern 24'$_1$. An oxygen ion-implanted layer 26'$_2$ reaching the sapphire substrate 21 is formed in the thin portion, i.e. the etched portion, of the polycrystal silicon layer 22 exposed around the SiO$_2$ film pattern 24'$_1$ while an oxygen ion-implanted layer 26'$_3$ not reaching the sapphire substrate 21 is formed in the thick portion (FIG. 4D).

(iii) After the SiO$_2$ film pattern 24'$_1$ is removed, the entire surface of the resultant structure is irradiated with Nd-YAG laser. The polycrystal silicon layer not having the oxygen ion-implanted layer is single crystallized and the oxygen ion-implanted layers 26'$_1$ to 26'$_3$ are transformed into silicon oxide layers, respectively. Specifically, an insular single crystal silicon layer 28 peripherally insulated by the silicon oxide film 27'$_1$ flush with the layer 28 is formed. A silicon oxide film 27'$_2$ not reaching the interface of the sapphire substrate 21 transformed from the oxygen ion-implantation layer 26'$_1$ is formed in a part of the surface layer of the single crystal silicon layer 28. A single crystal silicon region 29$_1$ is formed under the oxide layer 27'$_2$. Further, a single crystal silicon region 29$_2$ with the same shape as that of the SiO$_2$ film pattern 24'$_2$ is formed in the vicinity of a part of the silicon oxide film 27'$_1$ and the sapphire substrate 21.

Figure 4F:
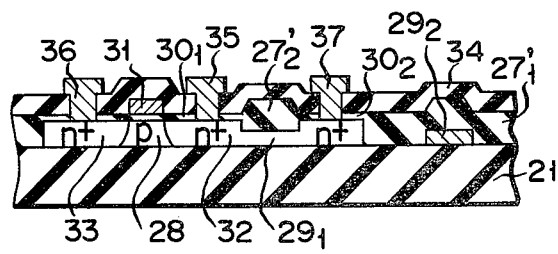

(iv) Then, in accordance with the steps of (iv) in the Example 3, an E-R type inverter is fabricated (FIG. 4F). In FIG. 4, like symbols are used for like or equivalent portions in FIG. 3 for simplicity of explanation.

According to the Example 4, the silicon oxide film 27'$_1$ for insulating the single crystal silicon layer 28 serving as the circuit element forming portion can be formed flush with the single crystal silicon layer 28.

Therefore, the E-R type inverted fabrication improves over the Example 3, in that it has a high reliability, without disconnection of the Al lead wires 35 to 37.

As described above, according to the present invention, the single crystal semiconductor layer and an insulation film for insulating it may simultaneously be formed on the single crystal insulation substrate, by a heat treatment for a short-time, not by the epitaxial growing process. As a consequence, according to the present invention, high performance semiconductor devices free from the impurity auto-doping from the single crystal insulation substrate can be fabricated in a mass-production manner.

What is claimed is:

1. A method of fabricating semiconductor devices comprising the steps of:
   forming a non-single crystalline semiconductor layer on a single crystalline insulation substrate;
   ion-implanting selectively material, which reacts with said semiconductor layer to form insulating material, into said semiconductor layer; and
   applying an energy radiation or a heat treatment to said semiconductor layer, whereby the non-single crystalline semiconductor layer portion not implanted with said material is single crystallized with a seed of said single crystalline insulation substrate and at the same time the non-single crystalline semiconductor layer portion implanted with said material is rendered an insulation material.

2. The method according to claim 1, in which the portion of said non-single crystalline semiconductor layer, into which ions are implanted, is thinner than the remaining portion of said semiconductor layer, before said ion-implantation is executed.

3. The method according to claim 1, in which a part of the surface of said ion-implanted region is covered with a film for controlling the depth of the ion-implantation, before said ion-implantation is executed.

4. The method according to claim 1, in which after the thickness of the non-single crystalline semiconductor layer into which ions are implanted is partially thinned, said ion-implantation is executed.

5. The method according to any one of claims 1 to 4, in which, prior to the energy beam radiation or heat treatment, material for disturbing the crystallizability is ion-implanted into at least the portion to be single crystallized in said non-single crystalline semiconductor layer.

6. The method according to claim 1, in which the material reacting with said single crystalline semiconductor layer to form insulation material is oxygen or nitrogen.

7. The method according to claim 1, in which said non-single crystalline semiconductor layer is a polycrystalline semiconductor layer or an amorphous semiconductor layer.

8. The method according to claim 5, in which material for disturbing the crystallizability to improve the energy absorption efficiency is selected from a group of silicon, germanium, and argon.

* * * * *